(12) United States Patent
Silvano De Sousa et al.

(10) Patent No.: US 11,665,826 B2
(45) Date of Patent: May 30, 2023

(54) COMPONENT CARRIER AND METHOD OF MANUFACTURING THE SAME

(71) Applicant: AT&S Austria Technologie & Systemtechnik Aktiengesellschaft, Leoben (AT)

(72) Inventors: Jonathan Silvano De Sousa, Vienna (AT); Erich Schlaffer, St. Lorenzen (AT)

(73) Assignee: AT&S Austria Technologie & Systemtechnik AG, Leoben (AT)

( * ) Notice: Subject to any disclaimer, the term of this patent is extended or adjusted under 35 U.S.C. 154(b) by 46 days.

(21) Appl. No.: 16/840,922

(22) Filed: Apr. 6, 2020

(65) Prior Publication Data

US 2020/0329563 A1    Oct. 15, 2020

(30) Foreign Application Priority Data

Apr. 10, 2019    (EP) ..................... 19168426

(51) Int. Cl.
*H05K 1/18* (2006.01)
*H05K 3/30* (2006.01)
*H05K 3/02* (2006.01)

(52) U.S. Cl.
CPC .............. *H05K 1/185* (2013.01); *H05K 3/30* (2013.01); *H05K 3/02* (2013.01); *H05K 2201/0338* (2013.01)

(58) Field of Classification Search
CPC .. H05K 1/18; H05K 3/02; H05K 3/30; H05K 1/185; H05K 2201/0338
USPC ....................................................... 361/761
See application file for complete search history.

(56) References Cited

U.S. PATENT DOCUMENTS

| | | |
|---|---|---|
| 2004/0113260 A1 | 6/2004 | Sunohara et al. |
| 2005/0255690 A1 | 11/2005 | Chen et al. |
| 2007/0178412 A1 | 8/2007 | Jung et al. |
| 2012/0247819 A1 | 10/2012 | Tsuyutani et al. |
| 2013/0267066 A1 | 10/2013 | Park et al. |
| 2015/0043126 A1 | 2/2015 | Hurwitz et al. |
| 2015/0195912 A1 | 7/2015 | Hurwitz et al. |
| 2016/0372432 A1 | 12/2016 | Tan |
| 2017/0117218 A1 | 4/2017 | Liu |

(Continued)

FOREIGN PATENT DOCUMENTS

| | | |
|---|---|---|
| CN | 106684061 A | 5/2017 |
| EP | 1 848 031 A1 | 10/2007 |
| WO | 2017011252 A1 | 1/2017 |

OTHER PUBLICATIONS

Extended European Search Report in Application No. 19168426.5; dated Jul. 23, 2019; pp. 1-9; European Patent Office, 80298, Munich, Germany.

(Continued)

*Primary Examiner* — Tremesha S Willis
(74) *Attorney, Agent, or Firm* — Robert A. Blaha; Smith Tempel Blaha LLC

(57) ABSTRACT

A component carrier includes a stack having at least one electrically conductive layer structure and/or at least one electrically insulating layer structure, a component including a terminal made of a first electrically conductive material and being embedded in the stack, a recess in the stack exposing at least a part of the terminal, an interface structure on the at least partially exposed terminal and an electrically conductive structure on the interface structure made of a second electrically conductive material.

5 Claims, 4 Drawing Sheets

(56) References Cited

U.S. PATENT DOCUMENTS

2017/0162508 A1 6/2017 Farooq et al.
2017/0287839 A1 10/2017 Lee et al.
2017/0294351 A1 10/2017 Knechtel et al.

OTHER PUBLICATIONS

Manook, R.; Communication Pursuant to Article 94(3) EPC in application No. 19168426.5, pp. 1-11; Jul. 26, 2022, European Patent Office; 80298, Munich, Germany.

COMPONENT CARRIER AND METHOD OF MANUFACTURING THE SAME

CROSS-REFERENCE TO RELATED APPLICATION

This application claims the benefit of the filing date of the European Patent Application No. 19 168 426.5, filed Apr. 10, 2019, the disclosure of which is hereby incorporated herein by reference.

TECHNICAL FIELD

The invention relates to a component carrier and to a method of manufacturing the component carrier.

TECHNOLOGICAL BACKGROUND

A conventional component carrier comprises a stack having at least one electrically conductive layer structure and/or at least one electrically insulating layer structure, wherein a component is embedded in the stack. The component comprises a terminal. The component carrier has a recess in the stack exposing the terminal. The material of the terminal is often copper so that the terminal can be interconnected by so called wet (galvanic) copper processes. In the case of embedding components in the component carrier, copper is the preferred material for a terminal of the component.

However, semiconductor components are sometimes manufactured with terminal metallization other than copper. Normally, the preferred surface metal is gold, which does not oxidize, is extremely resistant and presents good properties for wire bonding. Gold cannot be interconnected by the wet (galvanic) copper processes. This fact remarkably reduces the number of options for directly embedding such a component in the component carrier.

SUMMARY

There may be a need for a component carrier and a method of manufacturing the same, by which the integration of any components can be facilitated.

According to an exemplary embodiment of the invention, a component carrier is provided. The component carrier comprises a stack having at least one electrically conductive layer structure and/or at least one electrically insulating layer structure; a component comprising a terminal made of a first electrically conductive material and being embedded in the stack; a recess in the stack exposing at least a part of the terminal; an interface structure on the at least partially exposed terminal; and an electrically conductive structure on the interface structure made of a second electrically conductive material.

According to another exemplary embodiment of the invention, a method of manufacturing a component carrier is provided. The method comprises forming a stack comprising at least one electrically conductive layer structure and/or at least one electrically insulating layer structure; embedding a component, comprising a terminal made of a first electrically conductive material, in the stack; forming a recess in the stack exposing at least a part of the terminal; forming an interface structure on the at least partially exposed terminal; and forming an electrically conductive structure on the interface structure made of a second electrically conductive material.

OVERVIEW OF EMBODIMENTS

For depositing the interface structure and the electrically conductive structure, metal deposition and sputtering processes (thin film deposition) can be used, such as HiPMS, Plasma, PECVD, CVD, laser ablation, electroless deposition, etc. As a result, the surface of any terminal of the embedded component can be prepared for a subsequent (e.g., galvanic) copper deposition. That is, any metallic terminals other than copper can be contacted with conventional galvanic copper.

As any terminal of the component can be interconnected, the costs of manufacturing the component can be reduced. It is further possible to include a metallization process in the framework of the present invention so that the metallization process is not necessarily to be done by a component manufacturer.

Due to the electrically conductive structure on the interface structure, a seed layer of copper such as a copper foil is not required.

By the present invention, the flexibility in embedding components is increased and limitations to the component manufacturers and to the customers are reduced.

In the following, further exemplary embodiments of the present invention will be explained.

In an embodiment, the second electrically conductive material is different from the first material.

In an embodiment, the first electrically conductive material is selected from a group consisting of aluminum, silver, titan, copper, gold, Si, SiC, $SiO_2$ and GaN. Thus, the first electrically conductive material can also be a semi-conducting material.

In an embodiment, the second electrically conductive material is copper.

In an embodiment, the interface structure comprises or is an adhesion promoter, in particular one of titanium, copper nitride, tungsten, chromium and nickel. The adhesion promoter can have a thickness in the range between 20 nm and 100 nm.

In an embodiment, the interface structure comprises or is a diffusion barrier, in particular nickel. The diffusion barrier can have a thickness in the range between 150 nm and 500 nm.

In an embodiment, the component carrier comprises at least one of the following features: the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein the electrically insulating layer structure comprises at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment of the method according, the second electrically conductive material is different from the first electrically conductive material.

In an embodiment of the method, the first electrically conductive material is selected from a group consisting of aluminum, silver, titan, copper, gold, Si, SiC, $SiO_2$ and GaN.

In an embodiment of the method, the second electrically conductive material is copper.

In an embodiment of the method, the interface structure comprises or is an adhesion promoter, in particular one of titanium, copper nitride, tungsten, chromium and nickel. The adhesion promoter can have a thickness in the range between 20 nm and 100 nm.

In an embodiment of the method, the interface structure comprises or is a diffusion barrier, in particular nickel. The diffusion barrier can have a thickness in the range between 150 nm and 500 nm.

In an embodiment of the method, forming the interface structure and the electrically conductive structure is carried out simultaneously with forming an interface structure and an electrically conductive structure in a through hole of the stack. The through hole can be a via.

In an embodiment of the method, an additional masking and lithography step can be carried out before depositing the interface structure so that the interface structure will be patterned or structured. For example, very thin films can be used as the mask, and in combination with sputtering processes or similar processes, very small line-space copper structures can be obtained. A stripping step can be performed after depositing the interface structure, where the mask is stripped off. Thereafter, the electrically conductive structure can be deposited thereon.

In an embodiment of the method, at least one of the interface structure and the electrically conductive structure can be deposited by a deposition process or a sputter process, such as thin film deposition, HiPMS (High-power impulse magnetron sputtering), CVD, PECVD, laser ablation, or electroless deposition.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of a group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of a group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a dynamic random access (DRAM) or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
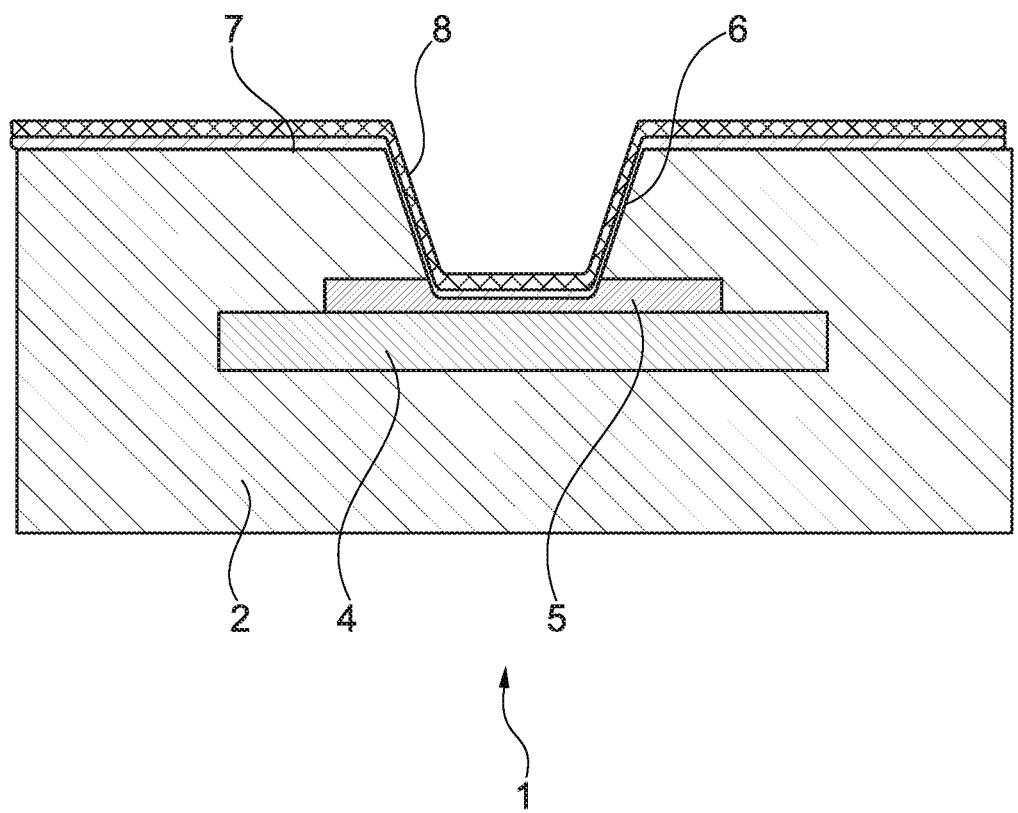
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 is shaped as a plate. The component carrier 1 can be configured as one of a group consisting of a printed circuit board, a substrate, and an interposer. The component carrier 1 can be configured as a laminate-type component carrier.

The component carrier 1 comprises a stack comprising at least one electrically conductive layer structure and at least one electrically insulating layer structure 2.

The at least one electrically conductive layer structure of the component carrier 1 can comprise at least one of a group consisting of copper, aluminum, nickel, silver, gold, palladium, and tungsten, any of the mentioned materials being optionally coated with supra-conductive material such as graphene.

The electrically insulating layer structure 2 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

A component 4 is embedded in the stack. The component 4 can be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

The component 4 comprises a terminal 5 which is made of a first electrically conductive material. The first electrically conductive material of the terminal 5 is not necessarily copper.

A recess 6 is provided in the stack so that at least a part of the terminal 5 is exposed. Note that the recess 6 may optionally expose the terminal 5 not only partially but completely. This can be done in order to avoid possible weak adhesion of the surfaces of the terminal 5 and the electrically insulating layer structure 2. The adhesion between the terminal 5 and the electrically insulating layer structure 2 will be solely based on the choice of materials. This issue basically applies to all embodiments. An interface structure 7 is provided on the exposed terminal 5, and an electrically conductive structure 8, which is made of a second electrically conductive material, is provided on the interface structure 7.

The second electrically conductive material is different from the first electrically conductive material. In particular, the first electrically conductive material can be selected from a group consisting of aluminum, silver, titan, copper, gold, Si, SiC, $SiO_2$ and GaN, and the second electrically conductive material can be copper.

The interface structure 7 can comprise or be an adhesion promoter, in particular one of titanium, copper nitride, tungsten, chromium and nickel. The adhesion promoter has a thickness in the range between 20 nm and 100 nm.

In addition or alternatively, the interface structure 7 can comprise or be a diffusion barrier, in particular nickel. The diffusion barrier has a thickness in the range between 150 nm and 500 nm.

Figure 2:
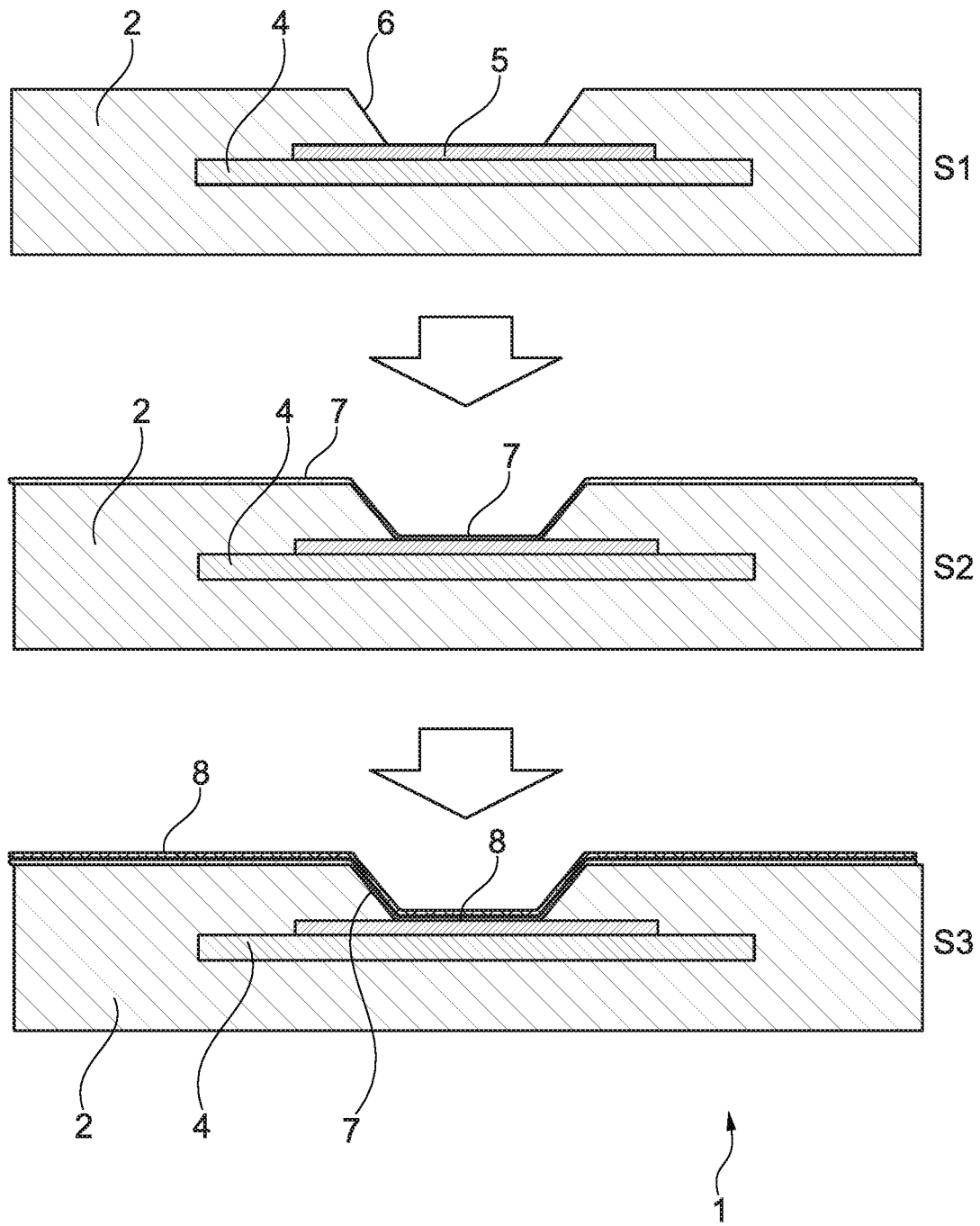
FIG. 2 illustrates a method of manufacturing a component carrier according to an exemplary embodiment of the invention.

FIG. 2 illustrates a method of manufacturing a component carrier 1 according to an exemplary embodiment of the invention.

In a step S1, a preform of a component carrier 1 is provided. The component carrier 1 is embodied as a PCB which comprises a stack having at least one electrically insulating layer structure 2 and optionally at least one electrically conductive layer structure. The component carrier 1 further comprises a component 4 comprising a terminal 5 made of a first electrically conductive material and being embedded in the stack. The first electrically conductive material of the terminal 5 is not necessarily copper. In particular, the first electrically conductive material can be selected from a group consisting of aluminum, silver, titan, copper, gold, Si, SiC, $SiO_2$ and GaN. The component carrier 1 further comprises a recess 6 in the stack exposing at least a part of the terminal 5.

The recess 6 can be a laser drilled hole which serves as connection between the outer surface of the component carrier 1 and the component 4. Once the laser hole 6 is formed, the component carrier 1 can optionally be cleaned, for example in a chemical bath, to clean the laser hole 6 and the outer surface of the component carrier 1.

In a step S2, an interface structure 7 is deposited on the exposed terminal 5. The interface structure 7 can be deposited by a metal deposition process or a sputter process, such as thin film deposition, HiPMS (High-power impulse magnetron sputtering), CVD, PECVD, laser ablation, electroless plating, etc. Thereby, the surface of the terminal 5, which is not made of copper, is prepared for a subsequent copper deposition. The interface structure 7 forms an adhesion promoter so that a copper material can adhere to the terminal 5 of the component 4. The adhesion promoter can be selected from a group consisting of titanium, copper nitride, aluminum nitride (AlN), tungsten, and chromium. More general, other oxides, nitrides, metal alloys or metals can be used for the interface structure 7. The adhesion promoter can have a thickness in the range between 20 nm and 100 nm. The interface structure 7 can be deposited not only on the interface structure 7 of the terminal 5 of the component 4, but also on the outer surface of the component carrier 1.

Alternatively or in addition to the adhesion promoter, the interface structure 7 can form a diffusion barrier, in particular if nickel is used therein. The diffusion barrier can have a thickness in the range between 150 nm and 500 nm. The diffusion barrier can also be deposited by a deposition process or a sputter process, such as thin film deposition, HiPMS (High-power impulse magnetron sputtering), CVD, PECVD, laser ablation, electroless deposition, etc.

As a result, the interface structure 7 can either comprise the adhesion promoter, the diffusion barrier or both.

In a step S3, an electrically conductive structure 8 made of a second electrically conductive material is deposited on the interface structure 7 and optionally also on the outer surface of the component carrier 1. The electrically conductive structure 8 can be a copper film (Cu). The electrically conductive structure 8 can also be deposited by a deposition process or a sputter process, such as thin film deposition, HiPMS (High-power impulse magnetron sputtering), CVD, PECVD, laser ablation, electroless deposition, etc.

After step S3, the component carrier 1 may be processed by conventional PCB manufacture steps. For example, a further copper layer can be applied on the electrically conductive structure 8 by galvanic electroplating or electroless deposition. The copper layer can then conventionally be patterned by lithography and etching processes. It is also possible to (completely) fill the recess 6 by copper.

Figure 3:
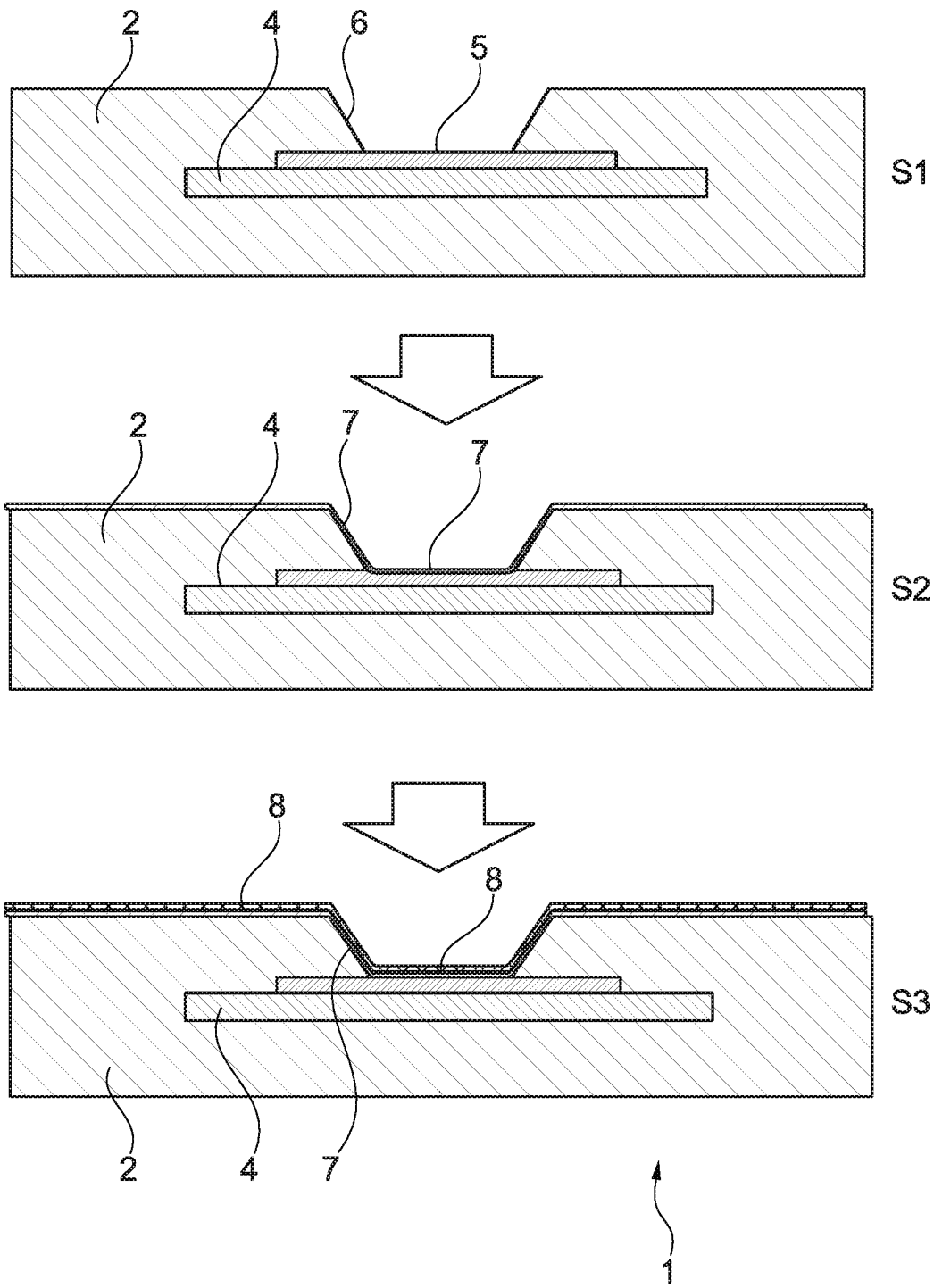
FIG. 3 illustrates a method of manufacturing a component carrier according to an exemplary embodiment of the invention.

FIG. 3 illustrates a method of manufacturing a component carrier 1 according to an exemplary embodiment of the invention. The method of FIG. 3 is similar to the method of FIG. 2 except for the following difference. The first electrically conductive material of the terminal 5 is gold (Au). The interface structure 7 may comprise nickel (Ni) or titanium or a combination of both as an adhesion promoter between the terminal 5, and a superposed electrically conductive structure 8 made of copper. In this case, the nickel layer as an adhesion promoter can be structured with conventional acid combinations.

The methods of FIGS. 2 and 3 can be modified by an additional masking and lithography step which is carried out before the step S2. The additional masking and lithography step is carried out so that the interface structure 7 will be patterned or structured. A mask can be formed by a photoresist or a dry film. Very thin films can be used as the mask, and in combination with the sputtering processes, very small line-space copper structures can be obtained. A stripping step can be performed after the step S2, where the mask is stripped off. Thereafter, the step S3 can be carried out.

It is also possible to carry out the stripping step after step S3.

Figure 4:
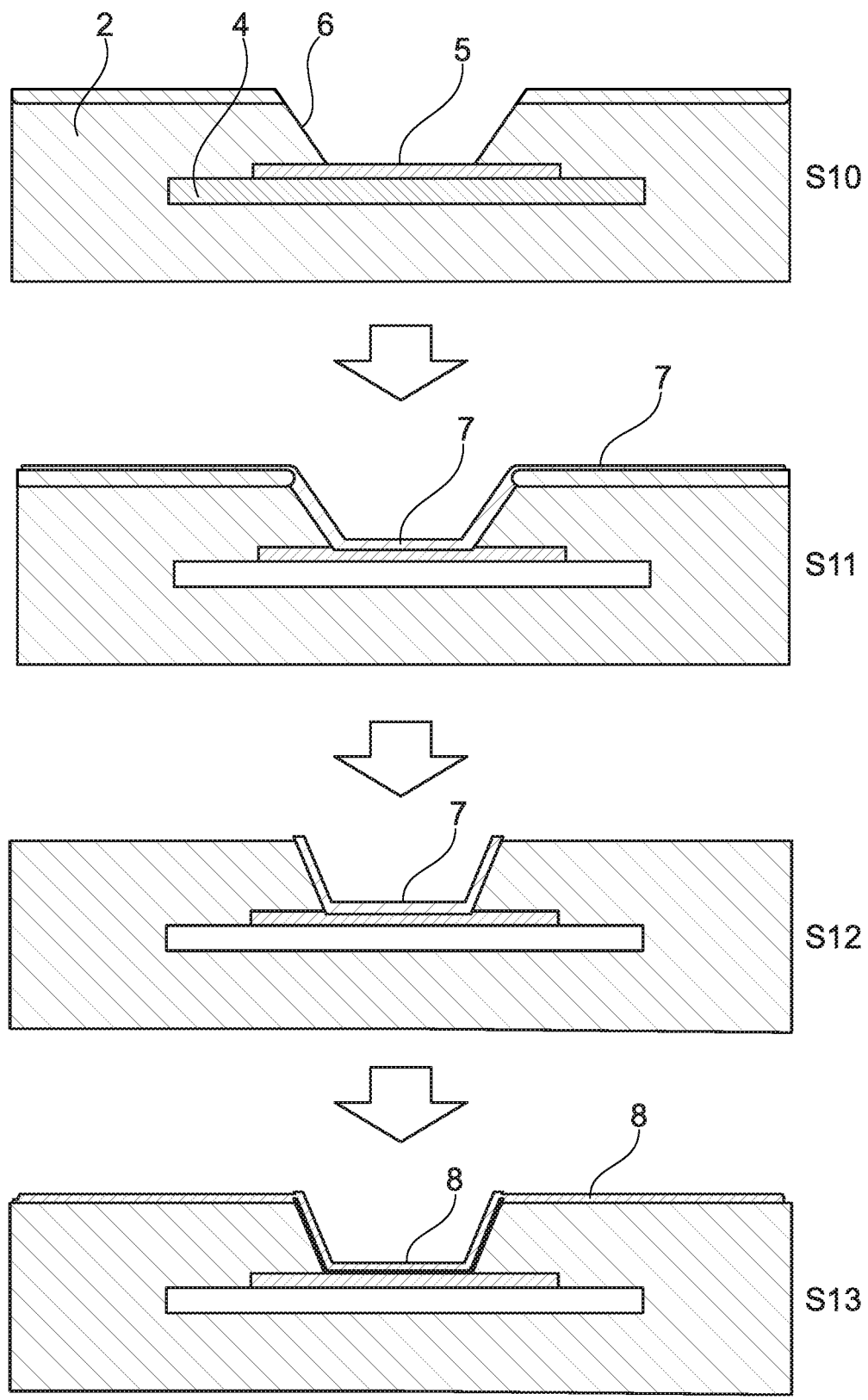
FIG. 4 illustrates a method of manufacturing a component carrier according to an exemplary embodiment of the invention.

FIG. 4 illustrates a method of manufacturing a component carrier 1 according to an exemplary embodiment of the invention. In this embodiment, the terminal 5 of the embedded component 4 does not have an electrical contact surface metallization. This means that the embedded component 4 can initially be provided with naked Si, SiC, $SiO_2$ or GaN material as the exposed terminal 5. In other words, a contact surface area of the terminal 5 may directly expose a component material of the embedded component 4, in particular Si, SiC, $SiO_2$ or GaN. This can reduce production costs because several steps of manufacturing the component 4 can be omitted, such as metallization, lithography, cleaning etc. The underlying concept is to produce a contact metallization of the terminal 5 of the component 4 when the same is already embedded in the electrically insulating layer structure 2. A laser process can be calibrated to stop drilling on a component surface, for example on a doped Si or $SiO_2$ surface. After that, a regular metallization of the terminal 5 of the component 4 can be done, for example by titan and/or copper. After that, the metallization process of the component carrier 1 will continue similar to the previous embodiments.

In a step S10, a recess 6 is formed by laser drilling in an electrically insulating layer structure 2. In this case, the upper surface of the component carrier 1 can be used as a stopping layer for the laser process. An oxide layer can be formed on the component carrier 1 to protect the same (for example a $SiO_2$ layer if the component carrier 1 is made of Silicon (Si)). A masking and lithography step is carried out so that the interface structure 7 will be patterned or structured.

The steps S11 and S13 correspond to steps S2 and S3 in FIGS. 2 and 3.

In a step S12, a stripping process is carried out where the mask is stripped-off.

The methods of FIGS. 2 to 4 can be modified by a via filling step, where a via (not shown) in the stack of the component carrier 1 is filled during the step S2/S11 and/or the step S3/S13. The parameters for the via filling step are basically an aspect ratio and a sputtering rate. For example, extra layers of gold (Au) or silver (Ag) can be applied in the via filling step. Instead of copper as the second electrically conductive material, gold, silver or any other metal can be used. This process can also be extended to the whole surface of the component carrier 1.

In the methods of FIGS. 2 to 4, the component 4 can be embedded either on a panel level, a wafer level or a PCB level. Centre core embedding and asymmetric embedding are possible.

Further, the sputtering metallization by the interface structure 7 and the electrically conductive structure 8 will allow the implementation of bio-compatible metals to the component carrier 1, such as titanium (Ti) and gold (Au), at any stage.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a stack comprising at least one electrically conductive layer structure and/or at least one electrically insulating layer structure, the stack being defined by a stack top surface and a stack bottom surface;
a component comprising a component body having a component body top surface and a component body bottom surface, and a terminal, the terminal being made of a first electrically conductive material and having a terminal uppermost surface being arranged in the stack and a terminal lowermost surface directly arranged on top of the component body top surface, the component and the terminal being embedded in the at least one electrically insulating layer structure of the stack;
a recess in the stack exposing at least a part of the terminal;
an interface structure on the at least partially exposed terminal, the interface structure having an interface structure top surface, wherein the interface structure contacts a surface which defines the recess in the stack; and
an electrically conductive structure at least partly arranged on top of the interface structure top surface and at least partly above the stack top surface, the electrically conductive structure being made of a second electrically conductive material;
wherein the second electrically conductive material is different from the first electrically conductive material;
wherein the first electrically conductive material is selected from a group consisting of aluminum, silver, titanium, gold, Si, SiC, $SiO_2$ and GaN; and
the second electrically conductive material is copper;
wherein the component carrier comprises at least one of the following features:
wherein the interface structure includes or is an adhesion promoter of one of titanium, copper nitride, tungsten, chromium and nickel, wherein the adhesion promoter has a thickness in the range between 20 nm and 100 nm; and
wherein the interface structure comprises or is a diffusion barrier of nickel, wherein the diffusion barrier has a thickness in the range between 150 nm and 500 nm.

2. The component carrier according to claim 1, comprising at least one of the following features:
the component carrier includes at least one component being surface mounted on and/or embedded in the component carrier, wherein the at least one component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein at least one of the electrically conductive layer structures of the component carrier includes at least one of a group consisting of copper, aluminum, nickel, silver, gold, palladium, and tungsten;
wherein the electrically insulating layer structure includes at least one of the group consisting of resin, reinforced or non-reinforced resin, epoxy resin or bismaleimide-triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;
wherein the component carrier is shaped as a plate;
wherein the component carrier is configured as one of a group consisting of a printed circuit board, a substrate, and an interposer;
wherein the component carrier is configured as a laminate-type component carrier.

3. A method of manufacturing a component carrier, comprising:

forming a stack including at least one electrically conductive layer structure and/or at least one electrically insulating layer structure, the stack being defined by a stack top surface and a stack bottom surface;

embedding a component in the stack, the component comprising a component body having a component body top surface and a component body bottom surface, and a terminal, the terminal being made of a first electrically conductive material and having a terminal uppermost surface being arranged below the stack top surface and a terminal lowermost surface directly arranged on top of the component body top surface, the component and the terminal being embedded in the at least one electrically insulating layer structure of the stack;

forming a recess in the stack exposing at least a part of the terminal;

forming an interface structure on the at least partially exposed terminal, the interface structure having an interface structure top surface, wherein the interface structure contacts a surface which defines the recess in the stack; and forming an electrically conductive structure at least partly on top of the interface structure top surface and at least partly above the stack top surface, the electrically conductive structure being made of a second electrically conductive material;

wherein the second electrically conductive material is different from the first electrically conductive material;

wherein the first electrically conductive material is selected from a group consisting of aluminum, silver, titanium, gold, Si, SiC, $SiO_2$ and GaN; and the second electrically conductive material is copper;

wherein the component carrier comprises at least one of the following features:

wherein the interface structure includes or is an adhesion promoter of one of titanium, copper nitride, tungsten, chromium and nickel, wherein the adhesion promoter has a thickness in the range between 20 nm and 100 nm; and wherein the interface structure comprises or is a diffusion barrier of nickel, wherein the diffusion barrier has a thickness in the range between 150 nm and 500 nm.

4. The method according to claim 3, wherein forming the interface structure and the electrically conductive structure is carried out simultaneously with forming an interface structure and an electrically conductive structure in a through hole of the stack.

5. The method according to claim 3, wherein at least one of the interface structure and the electrically conductive structure are deposited by a deposition process or a sputter process, a thin film deposition, high-power impulse magnetron sputtering, chemical-vapor deposition, plasma-enhanced chemical-vapor deposition, laser ablation, or electroless deposition.

* * * * *

UNITED STATES PATENT AND TRADEMARK OFFICE
CERTIFICATE OF CORRECTION

| | |
|---|---|
| PATENT NO. | : 11,665,826 B2 |
| APPLICATION NO. | : 16/840922 |
| DATED | : May 30, 2023 |
| INVENTOR(S) | : Jonathan Silvano De Sousa and Erich Schlaffer |

Page 1 of 1

It is certified that error appears in the above-identified patent and that said Letters Patent is hereby corrected as shown below:

In the Claims

In Claim 1, in Column 9, Line 56:
Please delete "and/or" and replace with -- and --.

Signed and Sealed this
Second Day of January, 2024

Katherine Kelly Vidal
*Director of the United States Patent and Trademark Office*